(12) United States Patent
Acharya

(10) Patent No.: US 6,766,286 B2
(45) Date of Patent: Jul. 20, 2004

(54) PYRAMID FILTER

(75) Inventor: Tinku Acharya, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 403 days.

(21) Appl. No.: 09/820,108

(22) Filed: Mar. 28, 2001

(65) Prior Publication Data

US 2002/0143832 A1 Oct. 3, 2002

(51) Int. Cl.$^7$ .......................... G06F 17/10; G06K 9/40
(52) U.S. Cl. .................. 703/300; 382/240; 382/260
(58) Field of Search .......................... 708/300, 301, 708/308; 382/240, 260

(56) References Cited

U.S. PATENT DOCUMENTS

| | | |
|---|---|---|
| 4,674,125 A | 6/1987 | Carlson et al. |
| 4,703,514 A | 10/1987 | Van Der Wal |
| 4,829,378 A | 5/1989 | LeGall |
| 5,359,674 A | 10/1994 | van der Wal |
| 5,561,617 A | 10/1996 | Van Der Wal |
| 5,875,122 A | 2/1999 | Acharya |
| 5,995,210 A | 11/1999 | Acharya |
| 6,009,201 A | 12/1999 | Acharya |
| 6,009,206 A | 12/1999 | Acharya |
| 6,047,303 A | 4/2000 | Acharya |
| 6,091,851 A | 7/2000 | Acharya |
| 6,094,508 A | 7/2000 | Acharya et al. |
| 6,108,453 A | 8/2000 | Acharya |
| 6,124,811 A | 9/2000 | Acharya et al. |
| 6,130,960 A | 10/2000 | Acharya |
| 6,151,069 A | 11/2000 | Dunton et al. |
| 6,151,415 A | 11/2000 | Acharya et al. |
| 6,154,493 A | 11/2000 | Acharya et al. |
| 6,166,664 A | 12/2000 | Acharya |
| 6,178,269 B1 | 1/2001 | Acharya |
| 6,195,026 B1 | 2/2001 | Acharya |
| 6,215,908 B1 | 4/2001 | Pazmino et al. |
| 6,215,916 B1 | 4/2001 | Acharya |
| 6,229,578 B1 | 5/2001 | Acharya et al. |
| 6,233,358 B1 | 5/2001 | Acharya |
| 6,236,433 B1 | 5/2001 | Acharya et al. |
| 6,236,765 B1 | 5/2001 | Acharya |
| 6,269,181 B1 | 7/2001 | Acharya |
| 6,275,206 B1 | 8/2001 | Tsai et al. |
| 6,285,796 B1 | 9/2001 | Acharya et al. |
| 6,292,114 B1 | 9/2001 | Tsai et al. |
| 6,301,392 B1 | 10/2001 | Acharya |
| 6,348,929 B1 | 2/2002 | Acharya et al. |
| 6,351,555 B1 | 2/2002 | Acharya et al. |
| 6,356,276 B1 | 3/2002 | Acharya |
| 6,366,692 B1 | 4/2002 | Acharya |
| 6,366,694 B1 | 4/2002 | Acharya |
| 6,373,481 B1 | 4/2002 | Tan et al. |
| 6,377,280 B1 | 4/2002 | Acharya et al. |
| 6,381,357 B1 | 4/2002 | Tan et al. |
| 6,392,699 B1 | 5/2002 | Acharya |
| 6,449,380 B1 | 9/2002 | Acharya et al. |
| 6,535,648 B1 | 3/2003 | Acharya |

OTHER PUBLICATIONS

K.R. Castleman, et al., "Simplified Design of Steerable Pyramid Filters", Perceptive Scientific Instruments, Inc., League City, TX, 1998 IEEE, XP 10289971, pp. 329–332.

Acharya, "A Memory Based VLSI Architecture for Image Compression", application No. 08/885,415, Filing Date Jun. 3, 1997, Atty Docket No. 042390.P4425, No. pp. 37.

Bawolek, et al., "Infared Correction System", application No. 09/126,203, Filing Date Jul. 30, 1998, Atty Docket No. 042390.P6172, No pp. 23.

Pazmino,et al., "Method of Compressing and/or Decompressing a Data Set Using Significance Mapping", application No. 09/151,336, Filing Date Sep. 11, 1998, Atty Docket No. 042390.P6391, No pp. 25.

(List continued on next page.)

Primary Examiner—Chuong Dinh Ngo
(74) Attorney, Agent, or Firm—Sharon Wong (57) ABSTRACT

Embodiments of a pyramid filter are described.

22 Claims, 6 Drawing Sheets

OTHER PUBLICATIONS

Tan, et al., "Reduction of Ringing Artifacts After Decompression OD A DWT–Based Compressed Image", application No. 09/165,511, Filing Date Oct. 2, 1998, Atty Docket No. 042390.P6220, No. pp. 20.

Tan, et al., "Robust Sequential Approach in Detecting Defective Pixels Within an Image Sensor", application No. 09/191,310, Filing Date Oct. 13, 1998, Atty Docket No. 042390.P6575, No. pp. 35.

Acharya, et al., "Color Interpolation for a Four Color Mosaic Pattern", application No. 09/197,836, Filing Date Nov. 24, 1998, Atty Docket No. 042390.P6376, No. pp. 26.

Acharya, "Enhancing Image Compression Performance by Morphological Processing", application No. 09/297,810, Filing Date Apr. 14, 1999, Atty Docket No. 042390.P6878, No pp. 30.

Tan, et al., "Using an Electronic Camera to Build a File Containing Text", application No. 09/301,753, Filing Date Apr. 29, 1999, Atty Docket No. 042390.P5742, No. pp. 21.

Tsai, et al., "Method and Apparatus for Adaptively Sharpening an Image", application No. 09/320,192, Filing Date May 26, 1999, Atty Docket No. 042390.P6452, No. pp. 29.

Tan, et al., "Method and Apparatus for Adaptively Sharpening Local Image Content of an Image", application No. 09/328,935, Filing Date Jun. 9, 1999, Atty Docket No. 042390.P7125, No pp. 29.

Tan, et al., "A Hardware Efficient Wavelet–Based Video Compression Scheme", application No. 042390.P6529, Filing Date Jun. 29, 1999, Atty Docket No. 042390.P6529, No pp. 32.

Acharya, et al., "Model–Based Video Image Coding", application No. 09/608,991, Filing Date Jun. 30, 2000, Atty Docket No. 042390.P8764, No. pp. 36.

Acharya, et al., "Image Processing Method and Apparatus", application No. 09/359,523, Filing date Jul. 23, 1999, Atty Docket No. 042390.P7323, No. pp. 16.

Tan, et al., "A Methodology for Color Correction with Noise Regulation", application No. 09/359,831, Filing Date Jul. 23, 1999, Atty Docket No. 042390.P7320, No. pp. 29.

Acharya, "Discreet Filter", application No. 09/432,337, Filing Date Sep. 2, 1999, Atty Docket No. 042390.P7626, No pp. 22.

Acharya, et al., "Zerotree Encoding of Wavelet Data", application No. 09/390,255, Filing Date Sep. 3, 1999, Atty Docket No. 042390.P7057, No. pp. 25.

Acharya, et al., "A Fuzzy Based Thresholding Technique for Image Segmentation", application No. 09/393,136, Filing Date Sep. 10, 1999, Atty Docket No. 042390.P7114, No pp. 28.

Acharya, et al., "A Fuzzy Distinction Based Thresholding Technique for Image Segmentation", application No. 09/393,017, Filing Date Sep. 10, 1999, Atty Docket No. 042390.P7115, No pp. 29.

Acharya "Video Motion Estimation", application No. 09/406,032, Filing Date Sep. 27, 1999, Atty Docket No. 042390.P7330, No pp. 24.

Acharya, et al., "Method of Compressing a Color Image", application No 09/411,697, Filing Date Oct. 1, 1999, Atty Docket No. 042390.P7463, No pp. 26.

Acharya, et al., Method of Interpolating Color Pixels Signals From a Subsampled Color Image, application No. 09/410,800, Filing Date Oct. 1, 1999, Atty Docket No. 042390.P7331, No pp. 20.

Acharya, et al., "Square Root Raised Cosine Symmetric Filter for Mobile Telecommunications", application No. 09/429,058, Filing Date Oct. 29, 1999, Atty Docket No. 042390.P7629, No. pp. 26.

Acharya, et al., "Indexing Wavelet Compressed Video for Efficient Data Handeling", application No.09/438,091, Filing Date Nov. 10, 1999, Atty Docket No. 042390.P6454, No pp. 29.

Metz, et al., "Image Processing Architecture", application No. 09/473,643, Filing Date Nov. 18, 1999, Atty Docket No 042390.P8050, No pp. 15.

Acharya, "Method of Upscaling a Color Image", application No. 09/461,080, Filing Date Dec. 14, 1999, Atty Docket No 042390.P7489, No pp. 22.

Acharya, "Method of Converting a Sub–Sampled Color Image", application No. 09/461,068, Filing Date Dec. 14, 1999, Atty Docket No. 042390.P7490, No pp. 22.

Acharya, et al., "Chip Rate Selectable Square Root Raised Cosine Filter for Mobile Telecommunications", application No. 09/467,487, Filing Date Dec. 20, 1999, Atty Docket No 042390.P8026, No pp. 44.

Miao, et al., "Dual Mode Filter for Mobile Telecommunications", application No. 09/467,611, Filing Date Dec. 20, 1999, Atty Docket No 042390.P8027, No pp. 49.

Acharya, "A Block–Matching Algorithm for Color Interpolation", application No.09/494,087, Filing Date Jan. 28, 2000, Atty Docket No. 042390.P5090D, No pp. 35.

Acharya, et al., "A Method of Inverse Quantizing Signals Samples of an Image During Image Decompression", application No. 09/507,213, Filing Date Feb. 18, 2000, No pp. 32.

Acharya, et al., "A Method of Quantizing Signal Samples of an Image During Image Compression", application No 09/507,399, Filing Date Feb. 18, 2000, Atty Docket No. 042390.P7135, No. pp. 24.

Acharya, et al., "Method of Intergrating a Watermark into an Image" application No. 09/519,874, Filing Date Mar. 6, 2000, Atty Docket No. 042390.P7136, No pp. 27.

Acharya, et al., "Method of Using Hue to Interpolate Color Pixel Signals", application No. 09/591,867, Filing Date Jun. 12, 2000, Atty Docket No. 042390.P8746, No pp. 23.

Kim, et al., "Method of Performing Motion Estimation", application No. 09/596,127, Filing Date Jun. 16, 2000, Atty Docket No. 042390.P8747, No pp. 29.

Dunton, et al., "Dual Mode Digital Camera for Video and Still Operation", application No. 09/595,055, Filing Date Jun. 16, 2000, Atty Docket No. 042390.P5079C, No pp. 30.

Acharya, et al, "Method of Compressing an Image", application No. 09/597,354, Filing Date Jun. 19, 2000, Atty Docket No. 042390.P8760, No pp. 23.

Acharya, et al., "Methods of Video Coding the Movement of a Human Face From a Sequence of Images", application No. 09/608,989, Filing Date Jun. 30, 2000, Atty Docket No. 042390.P8762, No pp. 25.

Acharya, et al., "Method of Video Coding Shoulder Movement From a Sequence of Images", application No. 09/607,724, Filing Date Jun. 30, 2000, Atty Docket No. 042390.P8763, No pp. 24.

Acharya, "Techniques to Implement Two–Dimensional Compression", application No. 09/664,131, Filing Date Sep. 18, 2000, Atty Docket No. 042390.P9922, No pp. 24.

Acharya, "Techniques to Implement One–Dimensional Compression", application No. 09/666,486, Filing Date Sep. 18, 2000, Atty Docket No. 042390.P9921, No pp. 18.

Acharya, "Sad Computation Architeceure", application No. 09/677,829, Filing Date Sep. 29, 2000, Atty Docket No. 042390.P9823, No pp. 24.

Acharya, et al., "A Method of Generating Huffman Code Length Information", application No. 09/704,392, Filing Date Oct. 31, 2000, Atty Docket No. 042390.P9804, No pp. 25.

Acharya, et al., "A Method of Performing Huffman Decoding", application No. 09/704,380, Filing Date Oct. 31, 2000, Atty Docket No. 042390.P9820, No pp. 26.

Acharya, "Method and Apparatus for Two–Dimensional Separable Symmetric Filtering", application No. 09/713,663, Filing Date Nov. 15, 2000, Atty Docket No. 042390.10409, No pp. 20.

Acharya, "Method and Apparatus for Multiply–Accumulate Two–Dimensional Sejparable Symmetric Filtering", application No. 09/718,877, Filing Date Nov. 20, 2000, Atty Docket No. 042390.P10545, No pp. 13.

Acharya, et al., "Developing an Euler Vector for Images", application No. 09/722,979, Filing Date Nov. 27, 2000, Atty Docket No. 042390.P10405, No pp. 45.

Acharya, et al., "Computing the Euler Number of a Binary Image" application No. 09/722,982, Filing Date Nov. 27, 2000, Atty Docket No. 042390.P10273, No pp. 31.

Acharya, et al, "Wavelet Coding of Video", application No. 09/722,988, Filing Date Nov. 27, 2000, Atty Docket No. 042390.P9822, No pp. 40.

Acharya, et al., Encoding of Wavelet Transformed Error Data, application No 09/723,123, Filing Date Nov. 27, 2000, Atty Docket No. 09/723,123, No pp. 38.

Acharya, et al., "Imaging Device Connected to Processor–Based System Using High–Bandwidth Bus", application No 09/726,773, Filing Date Nov. 29, 2000, Atty Docket No. 042390.P10274, No pp. 31.

Acharya, et al., "A Method for Block–Based Digital Image Watermarking", application No. 09/727,288, Filing Date Nov. 29, 2000, Atty Docket No. 042390.P10266, No pp. 11.

Acharya, et al., "Color Filter Array and Color Interpolation Algorithm", application No 09/727,038, Filing Date Nov. 30, 2000, Atty Docket No. 042390.P10263, No pp. 36.

Acharya, et al., "Method of Generating a Length–Contrained Huffman Code", application No. 09/705,314, Filing Date Nov. 30, 2000, Atty Docket No. 042390.P10245, No pp. 17.

Kim, et al., "Method of Performing Video Encoding Rate Control", application No 09/754,227, Filing Date Jan. 3, 2001, Atty Docket No. 042390.P10264, No pp. 28.

Kim, et al., "Method of Performing Video Encoding Rate Control Using Motion Estimation", application No. 09/754,683, Filing Date Jan. 3, 2001, Atty Docket No. 042390.P10265, No pp. 27.

Kim, et al., "Method of Performing Video Encoding Rate Control Using Bit Budget", application No. 09/754,682, Filing Date Jan. 3, 2001, Atty Docket No. 042390.P10587, No pp. 25.

Peter J. Burt, et al., "The Laplacian Pyramid as a Compact Image Code", IEEE Transactions on Communications, vol. Com–31, No. 4, Apr. 1983, XP–000570701, p.532.

Sahinoglou, et al., "A High–Speed Pyramid Image Coding Algorithm for a VLSI Implementation", IEEE Transactions of Circuits and Systems for Video Technology, vol. 1, No. 4, NY, Dec. 1991, XP–000249319, p. 369.

Dongning Li, "Minimum Number of Adders for Implementing a Multiplier and Its Application to the Design of Multiplierless Digital Filters", IEEE Transactions on Citcuits and Systems II: Analog and Digital Signal Processing, No. 7, NY, Jul. 1995, p. 453.

Dempster, et al., "Comments on Minimum Number of Adders for Implementing a Multiplier and Its Application to the Design of multiplierless Digital Filters", Analog and Digital Signal Processing, vol. 45, No. 2, IEEE Feb. 1998, XP–000771370, p. 242.

Jaehne B., "Digitale Bildverarbeitung", 1991, Springer–Verlag, Berlin Heidelberg, NY, XP–002208396, p. 107.

International Journal of Computer Vision, :A VLSI Pyramid Chip for Multiresolution Image Analysis, G. Van Der Wal, et al., Sep. 1, 1992, pp. 177–189.

Abeysekera S, et al., 'Design of multiplier free FIR filters using a LADF sigma–delta mudulator' 2000 IEEE, pp. 65–68, vol. 2 XP001050266.

CHRONOLOGICAL SEQUENCE OF THE SIGNALS $S_3, S_5, \ldots S_7$

| x | $S_3$ | $S_5$ | $S_7$ |
|---|---|---|---|
| $x_0$ | $x_0$ | $x_0$ | $x_0$ |
| $x_1$ | $x_0 + x_1$ | $x_0 + x_1$ | $x_0 + x_1$ |
| $x_2$ | $x_0 + x_1 + x_2$ | $x_0 + x_1 + x_2$ | $x_0 + x_1 + x_2$ |
| $x_3$ | $x_1 + x_2 + x_3$ | $x_0 + x_1 + x_2 + x_3$ | $x_0 + x_1 + x_2 + x_3$ |
| $x_4$ | $x_2 + x_3 + x_4$ | $x_0 + x_1 + x_2 + x_3 + x_4$ | $x_0 + x_1 + x_2 + x_3 + x_4$ |
| $x_5$ | $x_3 + x_4 + x_5$ | $x_1 + x_2 + x_3 + x_4 + x_5$ | $x_0 + x_1 + x_2 + x_3 + x_4 + x_5$ |
| $x_6$ | $x_4 + x_5 + x_6$ | $x_2 + x_3 + x_4 + x_5 + x_6$ | $x_0 + x_1 + x_2 + x_3 + x_4 + x_5 + x_6$ |
| $x_7$ | $x_5 + x_6 + x_7$ | $x_3 + x_4 + x_5 + x_6 + x_7$ | $x_1 + x_2 + x_3 + x_4 + x_5 + x_6 + x_7$ |
| $x_8$ | $x_6 + x_7 + x_8$ | $x_4 + x_5 + x_6 + x_7 + x_8$ | $x_2 + x_3 + x_4 + x_5 + x_6 + x_7 + x_8$ |
| $x_9$ | $x_7 + x_8 + x_9$ | $x_5 + x_6 + x_7 + x_8 + x_9$ | $x_3 + x_4 + x_5 + x_6 + x_7 + x_8 + x_9$ |
| $x_{10}$ | $x_8 + x_9 + x_{10}$ | $x_6 + x_7 + x_8 + x_9 + x_{10}$ | $x_4 + x_5 + x_6 + x_7 + x_8 + x_9 + x_{10}$ |

FIG. 5

| x | $S_3$ ($B_3$) | $S_5$ ($B_5$) | $S_7$ ($B_7$) |
|---|---|---|---|
| $x_0$ | $S_0^3 = x_0$ $(B_0^3 = 0 + S_0^3 = x_0)$ | $S_0^5 = x_0$ $(B_0^5 = 0 + S_0^5 = x_0)$ | $S_0^7 = x_0$ $(B_0^7 = 0 + S_0^7 = x_0)$ |
| $x_1$ | $S_1^3 = x_0 + x_1$ $(B_1^3 = x_0 + S_1^3 = 2x_0 + x_1)$ | $S_1^5 = x_0 + x_1$ $(B_1^5 = B_0^3 + S_1^5 = 2x_0 + x_1)$ | $S_1^7 = x_0 + x_1$ $(B_1^7 = B_0^5 + S_1^7 = 2x_0 + x_1)$ |
| $x_2$ | $S_2^3 = x_0 + x_1 + x_2$ $(B_2^3 = x_1 + S_2^3 = x_0 + 2x_1 + x_2)$ | $S_2^5 = x_0 + x_1 + x_2$ $(B_2^5 = B_1^3 + S_2^5 = 3x_0 + 2x_1 + x_2)$ | $S_2^7 = x_0 + x_1 + x_2$ $(B_2^7 = B_1^5 + S_2^7 = 3x_0 + 2x_1 + x_2)$ |
| $x_3$ | $S_3^3 = x_1 + x_2 + x_3$ $(B_3^3 = x_2 + S_3^3 = x_1 + 2x_2 + x_3)$ | $S_3^5 = x_0 + x_1 + x_2 + x_3$ $(B_3^5 = B_2^3 + S_3^5 = 2x_0 + 3x_1 + 2x_2 + x_3)$ | $S_3^7 = x_0 + x_1 + x_2 + x_3$ $(B_3^7 = B_2^5 + S_3^7)$ |
| $x_4$ | $S_4^3 = x_2 + x_3 + x_4$ $(B_4^3 = x_3 + S_4^3 = x_2 + 2x_3 + x_4)$ | $x_0 + x_1 + x_2 + x_3 + x_4$ $(B_4^5 = B_3^3 + S_4^5 = x_0 + 2x_1 + 3x_2 + 2x_3 + x_4)$ | $S_4^7 = x_0 + x_1 + x_2 + x_3 + x_4$ $(B_4^7 = B_3^5 + S_4^7)$ |
| $x_5$ | $S_5^3 = x_3 + x_4 + x_5$ $(B_5^3 = x_4 + S_5^3 = x_3 + 2x_4 + x_5)$ | $x_1 + x_2 + x_3 + x_4 + x_5$ $(B_5^5 = B_4^3 + S_5^5 = x_1 + 2x_2 + 3x_3 + 2x_4 + x_5)$ | $S_5^7 = x_0 + x_1 + x_2 + x_3 + x_4 + x_5$ $(B_5^7 = B_4^5 + S_5^7)$ |
| $x_6$ | $S_6^3 = x_4 + x_5 + x_6$ $(B_6^3 = x_5 + S_6^3 = x_4 + 2x_5 + x_6)$ | $x_2 + x_3 + x_4 + x_5 + x_6$ $(B_6^5 = B_5^3 + S_6^5 = x_2 + 2x_3 + 3x_4 + 2x_5 + x_6)$ | $x_0 + x_1 + x_2 + x_3 + x_4 + x_5 + x_6$ $(B_6^7 = B_5^5 + S_6^7)$ |

FIG. 6A

| | | | |
|---|---|---|---|
| $x_7$ | $S_7^3 = x_5 + x_6 + x_7$ $(B_7^3 = x_6 + S_7^3 = x_5 + 2x_6 + x_7)$ | $x_3 + x_4 + x_5 + x_6 + x_7$ $(B_7^5 = B_6^3 + S_7^5 = x_3 + 2x_4 + 3x_5 + 2x_6 + x_7)$ | $x_1 + x_2 + x_3 + x_4 + x_5 + x_6 + x_7$ $(B_7^7 = B_6^5 + S_7^7)$ |
| $x_8$ | $S_8^3 = x_6 + x_7 + x_8$ $(B_8^3 = x_7 + S_8^3 = x_6 + 2x_7 + x_8)$ | $x_4 + x_5 + x_6 + x_7 + x_8$ $(B_8^5 = B_7^3 + S_8^5 = x_4 + 2x_5 + 3x_6 + 2x_7 + x_8)$ | $x_2 + x_3 + x_4 + x_5 + x_6 + x_7 + x_8$ $(B_8^7 = B_7^5 + S_8^7)$ |
| $x_9$ | $S_9^3 = x_7 + x_8 + x_9$ $(B_9^3 = x_8 + S_9^3 = x_7 + 2x_8 + x_9)$ | $x_5 + x_6 + x_7 + x_8 + x_9$ $(B_9^5 = B_8^3 + S_9^5 = x_5 + 2x_6 + 3x_7 + 2x_8 + x_9)$ | $x_3 + x_4 + x_5 + x_6 + x_7 + x_8 + x_9$ $(B_9^7 = B_8^5 + S_9^7)$ |
| $x_{10}$ | $S_{10}^3 = x_8 + x_9 + x_{10}$ $(B_{10}^3 = x_9 + S_{10}^3 = x_8 + 2x_9 + x_{10})$ | $x_6 + x_7 + x_8 + x_9 + x_{10}$ $(B_{10}^5 = B_9^3 + S_{10}^5 = x_6 + 2x_7 + 3x_8 + 2x_9 + x_{10})$ | $x_4 + x_5 + x_6 + x_7 + x_8 + x_9 + x_{10}$ $(B_{10}^7 = B_9^5 + S_{10}^7)$ |

FIG. 6B

PYRAMID FILTER

RELATED APPLICATIONS

This patent application is related to U.S. patent application Ser. No. 09/754,684, titled "Multiplierless Pyramid Filter," filed Jan. 3, 2001, by Tinku Acharya now U.S. Pat. No. 6,662,200, and U.S. patent application Ser. No. 09/817,711, titled "Two Dimensional Pyramid Filter Architecture," (attorney docket no. 042390.P11275), filed Mar. 26, 2001, by Tinku Acharya, both assigned to the assignee of the present invention and herein incorporated by reference.

BACKGROUND

This disclosure is related to pyramid filters.

In image processing it is often desirable to decompose an image, such as a scanned color image, into two or more separate image representations. In this context, these are referred to as background and foreground images. For example, a color or gray-scale document image can be decomposed into background and foreground images for efficient image processing operations such as enhancement, compression, etc. as applied in a typical photocopying machine or scanner device. In this context, this operation is often referred to descreening operation. This descreening is also sometimes applied to remove halftone patterns that may exist in an original scanned image. For example, these halftone patterns may cause objectionable artifacts for human eyes if not properly removed. The traditional approach for this decomposition or descreening is to filter the color image in order to blur it. These blurred results are then used to assist in determining how much to blur and sharpen the image in order to produce the decomposition. Typically this blurring can be achieved using a "symmetric pyramid" filter. Symmetric pyramid finite impulse response (FIR) filters are well-known.

Figure 1:
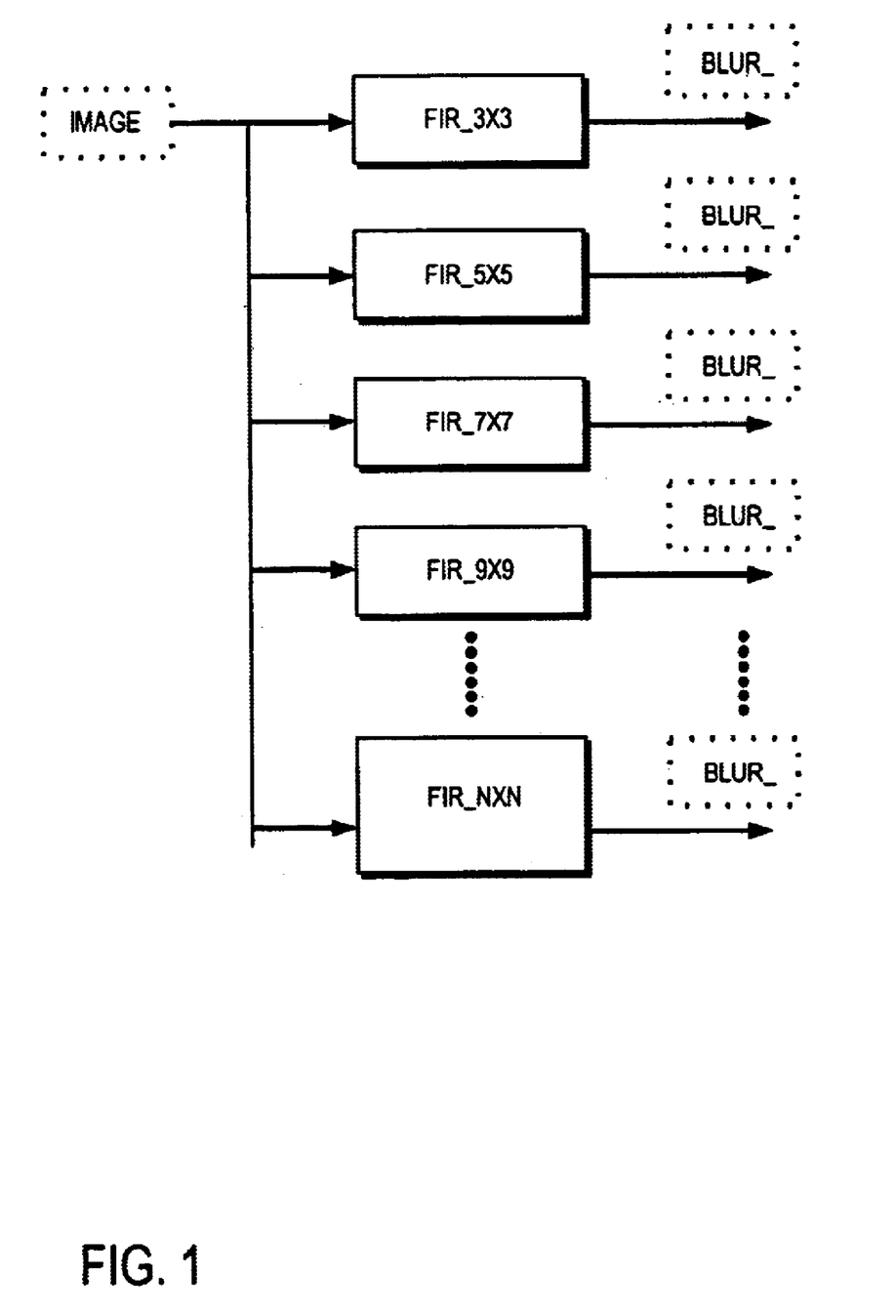
FIG. 1 is a block diagram illustrating a brute force approach to implementing a finite impulse response (FIR) multiple pyramid filtering architecture.

One disadvantage of this image processing technique, however, is that the complexity increases many fold when a number of pyramid filters of different sizes are applied in parallel in order to generate multiple blurred images, to apply the technique as just described. A brute force approach for this multiple pyramid filtering approach is to use multiple FIR filters in parallel, as illustrated in FIG. 1. Such an approach demonstrates that the design and implementation of fast "symmetric pyramid filtering" architectures to generate different blurred images in parallel from a single source image may be desirable.

The numbers provided in parenthesis for each FIR block in FIG. 1 represent the pyramid filter of corresponding length. For example, (1, 2, 1) are the filter coefficients for a symmetric pyramid finite impulse response (FIR) filter of order or length 3. Likewise, (1, 2, 3, 2, 1) are the coefficients for an FIR pyramid filter of order 5, and so forth.

Unfortunately, the approach demonstrated in FIG. 1 has disadvantages. For example, inefficiency may result from redundant computations. Likewise, FIR implementations frequently employ multiplier circuits. While implementations exist to reduce or avoid the use of multipliers, such as with shifting and summing circuitry, that may then result in increased clocking and, hence, may reduce circuit throughput. A need, therefore, exists for improving pyramid filtering implementations or architectures.

BRIEF DESCRIPTION OF THE DRAWINGS

Subject matter regarded is particularly pointed out and distinctly claimed in the concluding portion of the specification. The claimed, however, both as to organization and method of operation, together with objects, features, and advantages thereof, may best be understood by reference of the following detailed description when read with the accompanying drawings in which:

DETAILED DESCRIPTION

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail in order so as not to obscure the claimed subject matter.

As previously described, pyramid filtering, in particular, symmetric pyramid filtering, may be employed in connection with color images or color image processing in order to decompose or descreen the image, such as into a background and foreground image, for example. Although the claimed subject matter is not limited in scope in this respect, in such a context, pyramid filtering architectures that reduce computational complexity or processing and/or hardware cost are particularly desirable. Likewise, implementations that are multiplerless, that is do not specifically employ multiplication in the implementation, are also desirable usually because such implementations or embodiments are cheaper to implement than those that employ or include multiplier circuits. Thus, even implementations that employ fewer multiplications are desirable.

Figure 2:
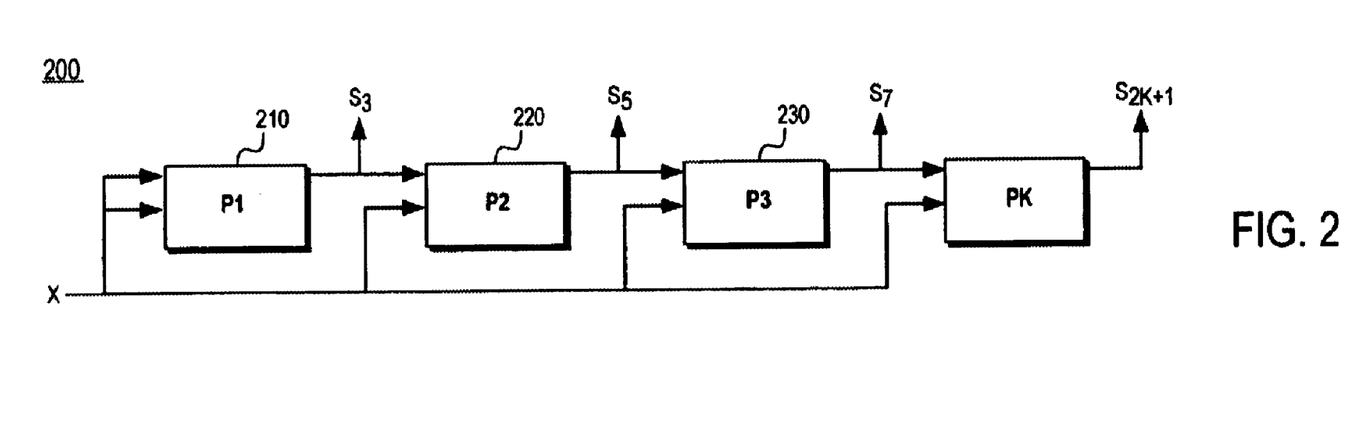
FIG. 2 is a portion of one embodiment of a rolling summation filter (RSF).
Figure 4:
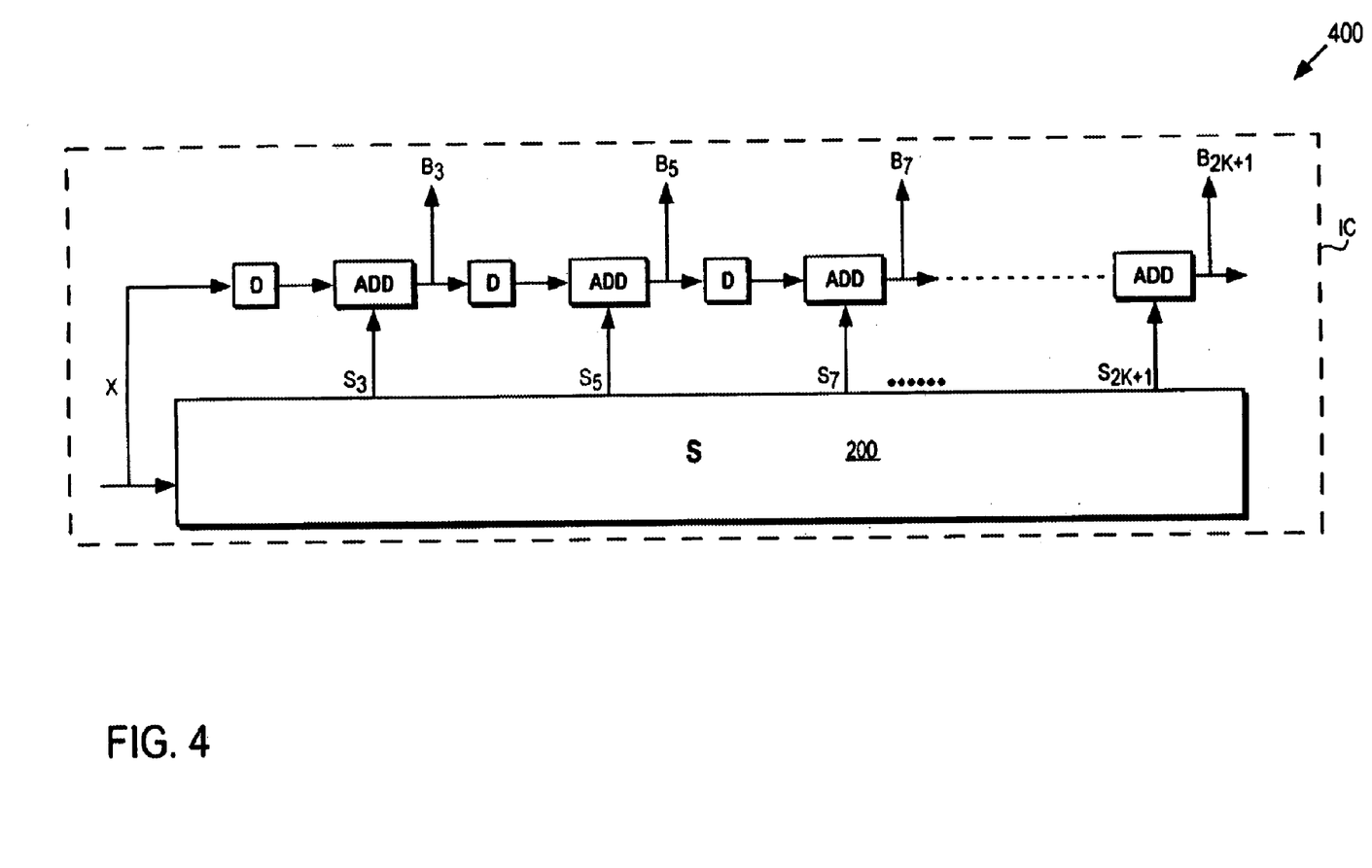
FIG. 4 is the embodiment of FIG. 2 in an embodiment of a multiplierless pyramid filter.

Although the claimed subject matter is not limited in scope in this respect, FIG. 2 illustrates one embodiment 200 of a "Rolling Summation Filter" or RSF architecture that may be used to implement a proposed pyramid filter, as described in more detail hereinafter. Embodiment 200 comprises a unified cascaded rolling summation filtering architecture to generate a multiple number of summed state variable signal streams $S_2$, $S_3$, $S_4$, . . . $S_7$ for a series or sequence of summation filters having different orders, such as of length 3, 5, 7 and so forth, the generation of the state variable signal streams occurring in parallel. In this particular embodiment, although the claimed subject matter is not limited in scope in this respect, a filtered state variable signal stream is produced on every clock cycle for each filter of a different order being implemented. Therefore, in addition to being computationally efficient, this particular embodiment produces good results in terms of throughput. As shall be described in more detail hereinafter, the state variable signal streams may be employed to produce pyramid filtered output signal streams as shown in FIG. 4.

FIG. 2 is understood in the context of specific notation. For example, an input source signal, X, may be designated as follows:

$$X=(X_0, X_1, \ldots, x_{i-2}, X_{i-1}, X_i, X_{i+1}, X_{i+2}, \ldots)$$

In digital or discrete signal processing, filtering may be expressed as a convolution, $\otimes$, of the input signal, X, and a filter, F, in this context a digital filter of finite length, referred to here as a finite impulse response (FIR) filter. Therefore, the filtered output signal stream is indicated as follows:

$$Y=X \otimes F$$

As previously described, this particular embodiment employs pyramid filters. These filters are typically implemented using digital filters of lengths or orders that are odd, such as 3, 5, 7, 9, etc. This may be expressed, for example, as M=2N+1, where N is a positive interger greater than one. Some examples of such digital filters are as follows:

$$F_3=(1, 2, 1)$$

$$F_5=(1, 2, 3, 2, 1)$$

$$F_7=(1, 2, 3, 4, 3, 2, 1)$$

$$F_9=(1, 2, 3, 4, 5, 4, 3, 2, 1)$$

$$F_M=(1, 2, 3, \ldots, N, \ldots, 3, 2, 1)$$

For the foregoing filters, the filtered output signals or output signal streams may be represented as follows:

$B^3=X \otimes F_3=(b_0^3, b_1^3, \ldots, b_{i-1}^3, b_i^3, b_{i+1}^3, \ldots)$ result of input signal X filtered by $F_3$ $B^5=X \otimes F_5=(b_0^5, b_1^5, \ldots, b_{i-1}^5, b_i^5, b_{i+1}^5, \ldots)$ result of input signal X filtered by $F_5$ $B^7=X \otimes F_7=(b_0^7, b_1^7, \ldots, b_{i-1}^7, b_i^7, b_{i+1}^7, \ldots)$ result of input signal X filtered by $F_7$ $B^9=X \otimes F_9=(b_0^9, b_1^9, \ldots, b_{i-1}^9, b_i^9, b_{i+1}^9, \ldots)$ result of input signal X filtered by $F_9$ $B^M=X \otimes F_M=(b_0^M, b_1^M, \ldots, b_{i-1}^M, b_i^M, b_{i+1}^M, \ldots)$ result of input signal X filtered by $F_M$ An alternate way to empirically represent these filtered output signal samples is as follows:

$$b_i^3=x_{i-2}+2x_{i-1}+x_i$$

$$b_i^5=x_{i-4}+2x_{i-3}+3x_{i-2}+2x_{i-1}+x_i$$

$$b_i^7=x_{i-6}+2x_{i-5}+3x_{i-4}+4x_{i-3}+3x_{i-2}+2x_{i-1}+x_i$$

$$b_i^9=x_{i-8}+2x_{i-7}+3x_{i-6}+4x_{i-5}+5x_{i-4}+4x_{i-3}+3x_{i-2}+2x_{i-1}+x_i$$

Likewise, by introducing what is referred to, in this context, as state variables, the above expressions may be re-expressed as follows:

$b_i^3=x_{i-1}+s_i^3$, where $s_i^3=x_{i-2}+x_{i-1}+x_i$ $b_i^5=b_{i-1}^3+s_i^5$, where $s_i^5=x_{i-4}+x_{i-3}+x_{i-2}+x_{i-11}+x_i$ $b_i^7=b_{i-1}^5+s_i^7$, where $s_i^7=x_{i-6}+x_{i-5}+x_{i-4}+x_{i-3}+x_{i-2}+x_{i-1}+x_i$ $b_i^9=b_{i-1}^7+s_i^9$, where $s_i^9=x_{i-8}+x_{i-7}+x_{i-6}+x_{i-5}+x_{i-4}+x_{i-3}+x_{i-2}+x_{i-1}+x_i$ A study of FIG. 4, as explained in more detail later, shall illustrate that the computed output signal streams, $B_3$, $B_5$, $B_7$, $B_9$, etc. may be produced by employing the embodiment illustrated in FIG. 2 as a portion of the embodiment shown in FIG. 4.

Figure 5:
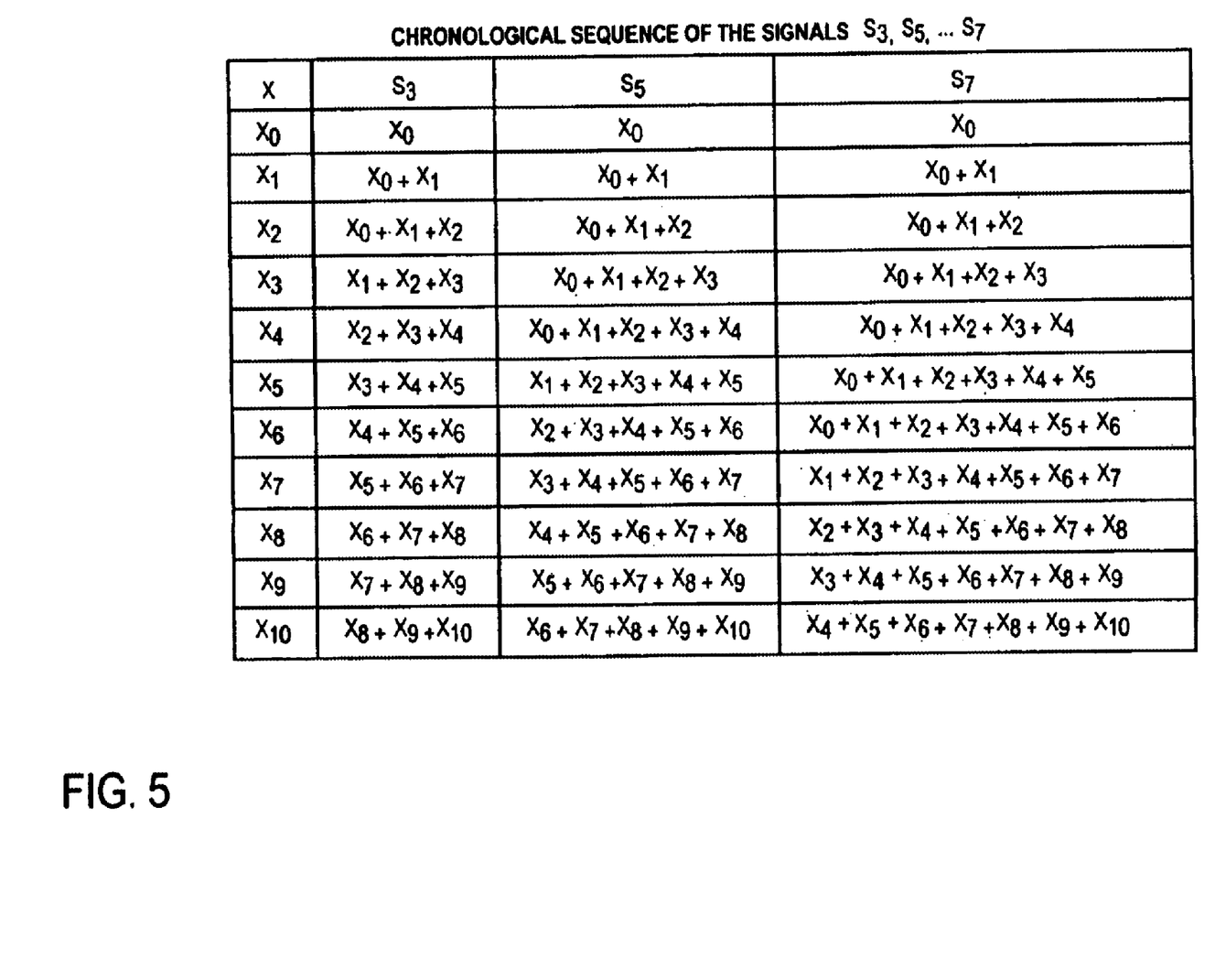
FIG. 5 is a table showing a chronological sequence of state variable signal samples for one implementation of rolling summation filter.
Figure 6A:
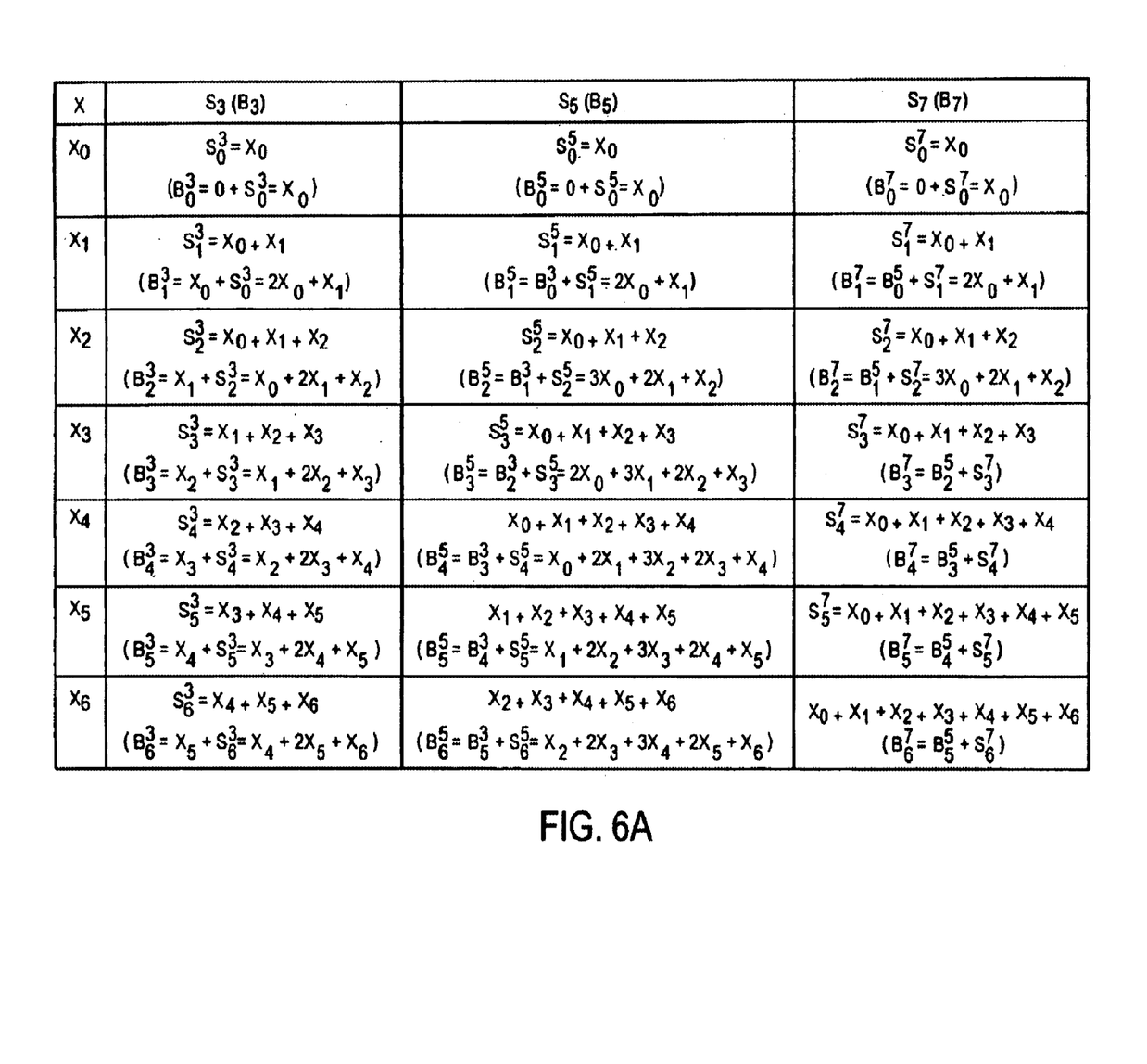
FIGS. 6A–6B are tables showing a chronological sequence of filtered output signal samples for one implementation of a pyramid filter.
Figure 6B:
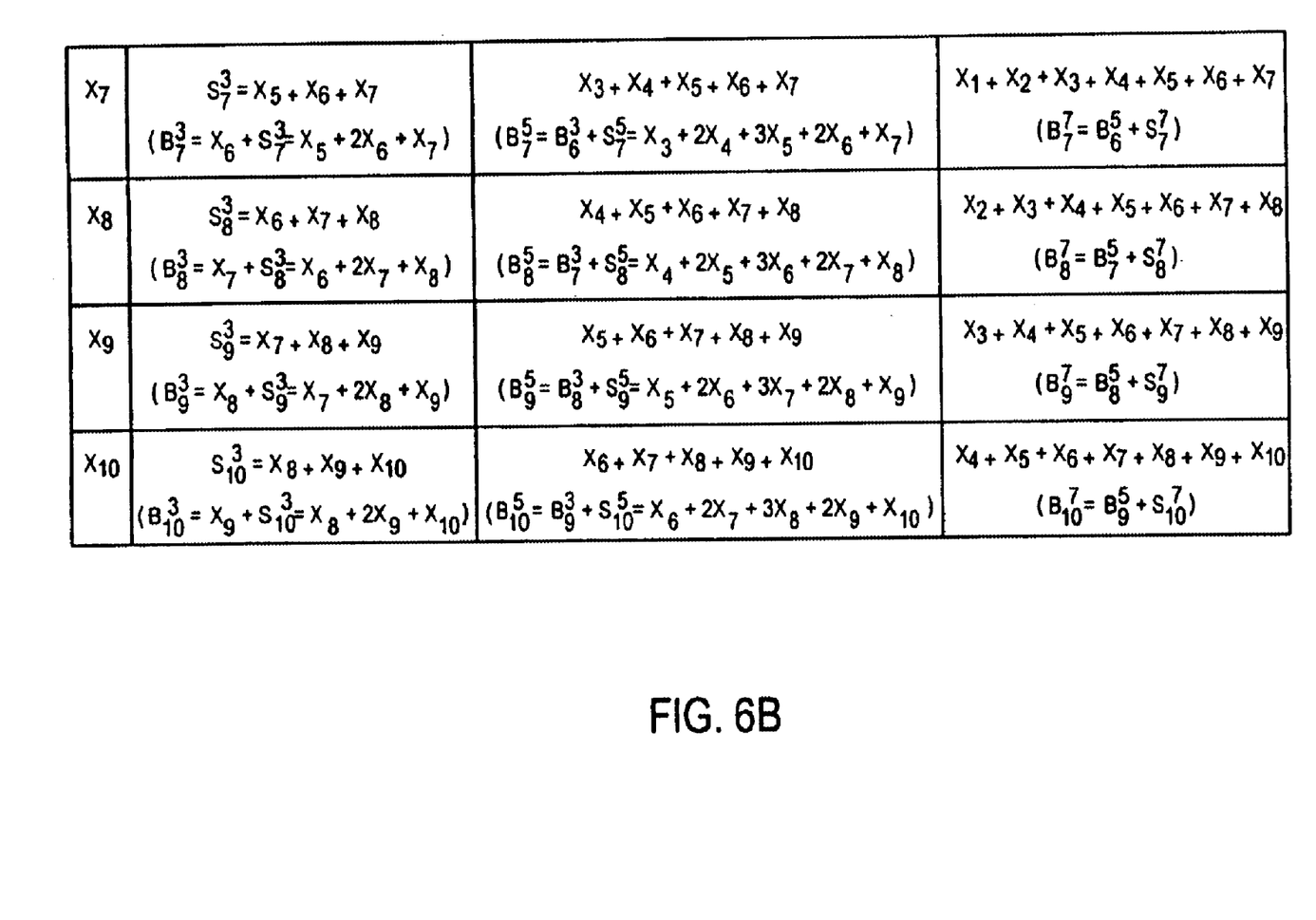

FIG. 5 is a table illustrating a chronological sequence of state variable signals or state variable signal streams, $S_2$, $S_3$, $S_4$, ... $S_7$ generated respectively as illustrated in FIG. 2, and described in more detail in connection with FIG. 3. Likewise, FIG. 6 is a table showing a chronological sequence of filtered output signal streams, $B_3$, $B_5$, $B_7$, etc. As illustrated in FIG. 4, these output signal streams are produced by employing adders, such as 275, 285, and 295, and delays, such as 270, 280 and 290.

In addition to providing the filtered output signal streams, $B_3$, $B_5$, $B_7$, the table in FIG. 6 illustrates the generation of these filtered output signal streams in chronological order of clocking as applied to the pyramid filter architecture embodiment shown in FIG. 2 to produce the state variable signal sample streams. As previously illustrated, output signal streams may be produced from signal samples, such as $x_i$ and $s_i$, that is the input signal samples and the state variable signal samples, as explained in more detail hereinafter.

The tables shown in FIGS. 6A–6B illustrate that $b_i^7$ is generated by adding input signal $b_i^5$ to $S_i^7$ in accordance with the equations provided previously. The signal $b_i^5$ is delayed by one clock cycle. This is accomplished, for example, by delay element or digital delay unit 290 in FIG. 4. Therefore, output signal sample $B_5$ delayed by one clock cycle is summed with state variable signal sample $S_7$ to generate output signal samples $B_7$. Likewise, digital delay unit 280 may be employed to generate output signal sample stream $B_5$. Likewise, the input signal sample stream, X, may be delayed and summed with $S_3$ to generate pyramid filter output signal sample stream $B_3$.

Figure 3:
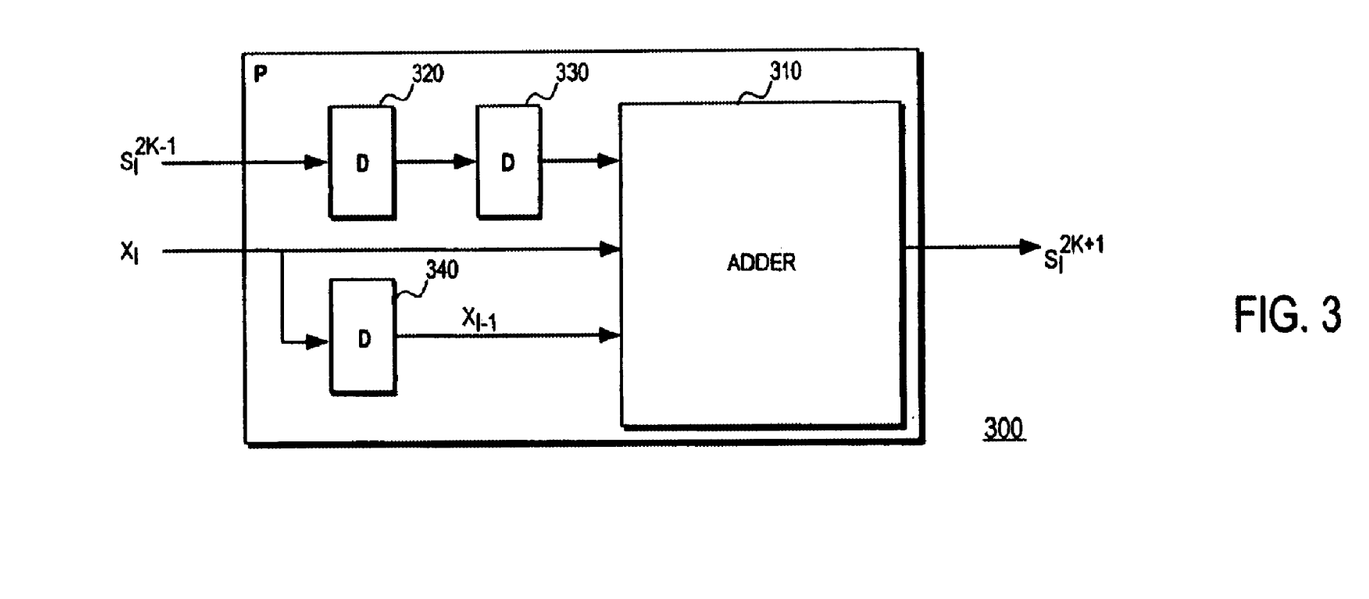
FIG. 3 is one embodiment of a component or subcomponent of FIG. 2.

It is noted that the embodiment of a RSF architecture shown in FIG. 2 includes an embodiment of a component or subcomponent, such as 300, as shown in FIG. 3. Embodiment 300 shown in FIG. 3 comprises a component including three delay units 310, 320 and 330 and a three-input port adder 340. A three-input or three-input port adder is employed in this particular embodiment to provide high speed implementation.

In this particular embodiment, the delay units and adder are coupled to produce higher order filtered state variable signal samples or signal sample streams from input signal samples or signal sample streams and lower order filtered state variable signal samples or signal sample streams. For example, referring to the embodiment shown in FIG. 3, $x_i$, comprises the input signal sample or signal sample stream, $S_i^{2k-1}$ comprises the lower order RSF filtered state variable signal samples or signal sample stream, and $S_i^{2k+1}$ represents the higher order RSF filtered state variable signal samples or signal sample stream. Therefore, in this particular embodiment, the difference in order between the higher and lower order state variable signal samples or signal sample streams is two, although, of course, the claimed subject matter is not limited in scope in this respect.

FIG. 4 is a schematic diagram of an embodiment of a pyramid filter that includes the embodiment of an RFS architecture shown in FIG. 2. In FIG. 4, the RFS architecture embodiment is designated as 200. Therefore, although not shown in FIG. 4, 200 includes components or subcomponents, such as 210, 220 or 230, shown in FIG. 2. It is noted that the embodiment shown in FIG. 4 is implemented on an integrated circuit 400, although the claimed subject matter is not restricted in scope in this respect.

It will, of course, be understood that, although particular embodiments have just been described, the claimed subject matter is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the claimed subject matter is not limited in scope in this respect, one embodiment may comprise an article, such as a storage medium. Such a storage medium, such as, for example, a CD-ROM, or a disk, may have stored thereon instructions, which when executed by a system, such as a computer system or platform, or an imaging system, for example, may result in an embodiment, such as an embodiment of a method of filtering or processing an image or video, for example, as previously described. For example, an image processing platform or an imaging processing system may include an image processing unit, a video or image input/output device and/or memory.

While certain features have been illustrated and described herein, many modifications, substitutions, changes and equivalents will now occur to those skilled in the art. It is, therefore, to be understood that the appended claims are intended to cover all such modifications and changes as fall within the true spirit of the claimed subject matter.

What is claimed is:

1. An integrated circuit comprising:
   a pyramid filter;
   said pyramid filter comprising a rolling summation filter.

2. The integrated circuit of claim 1, wherein said rolling summation filter comprises a sequence of cascaded units, each of said units producing a different order state variable signal sample stream.

3. The integrated circuit of claim 2, wherein said units comprise multiplierless units.

4. The integrated circuit of claim 3, wherein at least one of said multiplierless units comprises three delay units and an adder, said delay units and adder being coupled to produce a higher order state variable signal sample stream from an input signal sample stream and a lower order state variable signal sample stream.

5. The integrated circuit of claim 4, wherein said adder comprises a three-input adder.

6. The integrated circuit of claim 4, wherein the difference in order between the higher and lower order state variable signal sample stream is two.

7. A filter component comprising:
   three delay units and an adder, said delay units and adder being coupled to produce a higher order state variable signal sample stream from an input signal sample stream and a lower order state variable signal sample stream.

8. The filter component of claim 7, wherein the difference in order between the higher and lower order state variable signal sample stream is two.

9. The filter component of claim 7, wherein the adder comprises a three-input adder.

10. The filter component of claim 7, wherein the filter component is coupledin a configuration to form a rolling summation filter.

11. A method of producing a filtered state variable signal sample stream of a first order comprising:
    delaying a filtered state variable signal sample stream of a second order, said
    second order being less than said first order;
    summing the delayed state variable signal sample stream with an input signal sample stream and a delayed version of the input signal sample stream.

12. The method of claim 11, wherein the difference between the first and second order is two.

13. The method of claim 11, wherein the delayed state variable signal stream is delayed by two clock cycles and the delayed version of the input signal sample stream is delayed by one clock cycle.

14. An article comprising: a storage medium, said storage medium having stored thereon instructions, that, when executed result in producing a filtered state variable signal sample stream of a first order by:
    delaying a filtered state variable signal sample stream of a second order, said second order being less than said first order;
    summing the delayed state variable signal sample stream with an input signal sample stream and a delayed version of the input signal sample stream.

15. The article of claim 14, wherein the instructions, when executed, further result in the difference between the first and second order being two.

16. The article of claim 14, wherein the instructions, when executed, further result in the delayed state variable signal stream being delayed by two clock cycles and the delayed version of the input signal sample stream being delayed by one clock cycle.

17. An image processing system comprising:
    an image processing unit to filter scanned color images;
    said image processing unit including at least one pyramid filter; said at least one pyramid filter comprising a rolling summation filter.

18. The image processing system of claim 17, wherein said rolling summation filter comprises a sequence of cascaded units, each of said units producing a different order state variable signal sample stream.

19. The image processing system of claim 18, wherein said units comprise multiplierless units.

20. The image processing system of claim 19, wherein at least one of said multiplierless units comprises three delay units and an adder, said delay units and adder being coupled to produce a higher order state variable signal sample stream from an input signal sample stream and a lower order state variable signal sample stream.

21. The image processing system of claim 20, wherein said adder comprises a three-input adder.

22. The image processing system of claim 20, wherein the difference in order between the higher and lower order state variable signal sample stream is two.

* * * * *

UNITED STATES PATENT AND TRADEMARK OFFICE
CERTIFICATE OF CORRECTION

PATENT NO. : 6,766,286 B2  
DATED : July 20, 2004  
INVENTOR(S) : Acharya

It is certified that error appears in the above-identified patent and that said Letters Patent is hereby corrected as shown below:

Column 3,  
Line 46, delete "$b_i^3 = x_{i-2} + 2x_{i-1} + x_i$" and insert -- $b_i^3 = x_{i-2} + 2x_{l-1} + x_i$ --.  
Line 51, delete "$b_i^9 = x_{i-8} + 2x_{i-7} + 3x_{i-6} + 4x_{i-5} + 5x_{l-4} + 4x_{l-3} + 3x_{l-2}\, 2x_{l-1} - x_i$" and insert -- $b_i^9 = x_{i-8} + 2x_{i-7} + 3x_{i-6} + 4x_{i-5} + 5x_{l-4} + 4x_{l-3} + 3x_{l-2} + 2x_{l-1} + x_i$ --

Column 4,  
Line 21, delete "$S_i^7$" and insert -- $s_i^7$ --.  
Line 45, delete "$x_i$," and insert -- $x_i$ --.  
Line 47, delete "$S_i^{2k-1}$" and insert -- $s_i^{2k-1}$ --.  
Line 48, delete "$S_i^{2k+1}$" and insert -- $s_i^{2k+1}$ --.

Column 5,  
Line 56, delete "coupledin" and insert -- coupled in --.

Signed and Sealed this

Nineteenth Day of October, 2004

JON W. DUDAS  
*Director of the United States Patent and Trademark Office*